United States Patent
Takahashi et al.

(10) Patent No.: US 6,777,934 B2
(45) Date of Patent: Aug. 17, 2004

(54) MAGNETIC RESONANCE IMAGING METHOD AND APPARATUS

(75) Inventors: Tetsuhiko Takahashi, Souka (JP); Masahiro Takizawa, Kashiwa (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 10/148,469

(22) PCT Filed: Dec. 8, 2000

(86) PCT No.: PCT/JP00/08701
§ 371 (c)(1),
(2), (4) Date: Sep. 5, 2002

(87) PCT Pub. No.: WO01/41639
PCT Pub. Date: Jun. 14, 2001

(65) Prior Publication Data
US 2003/0052676 A1 Mar. 20, 2003

(30) Foreign Application Priority Data
Dec. 8, 1999 (JP) .......................................... 11-349323

(51) Int. Cl.[7] ................................................ G01V 3/00
(52) U.S. Cl. ...................................... 324/309; 324/307
(58) Field of Search ................................ 324/309, 318, 324/307; 600/410, 407; 128/653.4

(56) References Cited

U.S. PATENT DOCUMENTS 6,469,505 B1 * 10/2002 Maier et al. ................. 324/309

* cited by examiner

Primary Examiner—Brij B. Shrivastav
(74) Attorney, Agent, or Firm—Antonelli, Terry, Stout & Kraus, LLP

(57) ABSTRACT

An MRI apparatus is provided for obtaining an image of a wide area using a multiple-coil, where a plural number of small receiving coils are arranged such that adjacent coils overlap spatially. An image is picked up while thinning a part of the measured data, such that the low spatial frequency region of the k space is dense and the high spatial frequency region thereof is sparse. The substantial sensitivity distribution of each small receiving coil is determined using data related to the low spatial frequency region, and an image is composed using the sensitivity distribution and the measured data to produce a high resolution image having no aliasing artifact in a short time.

19 Claims, 13 Drawing Sheets sensitivity distribution calculation

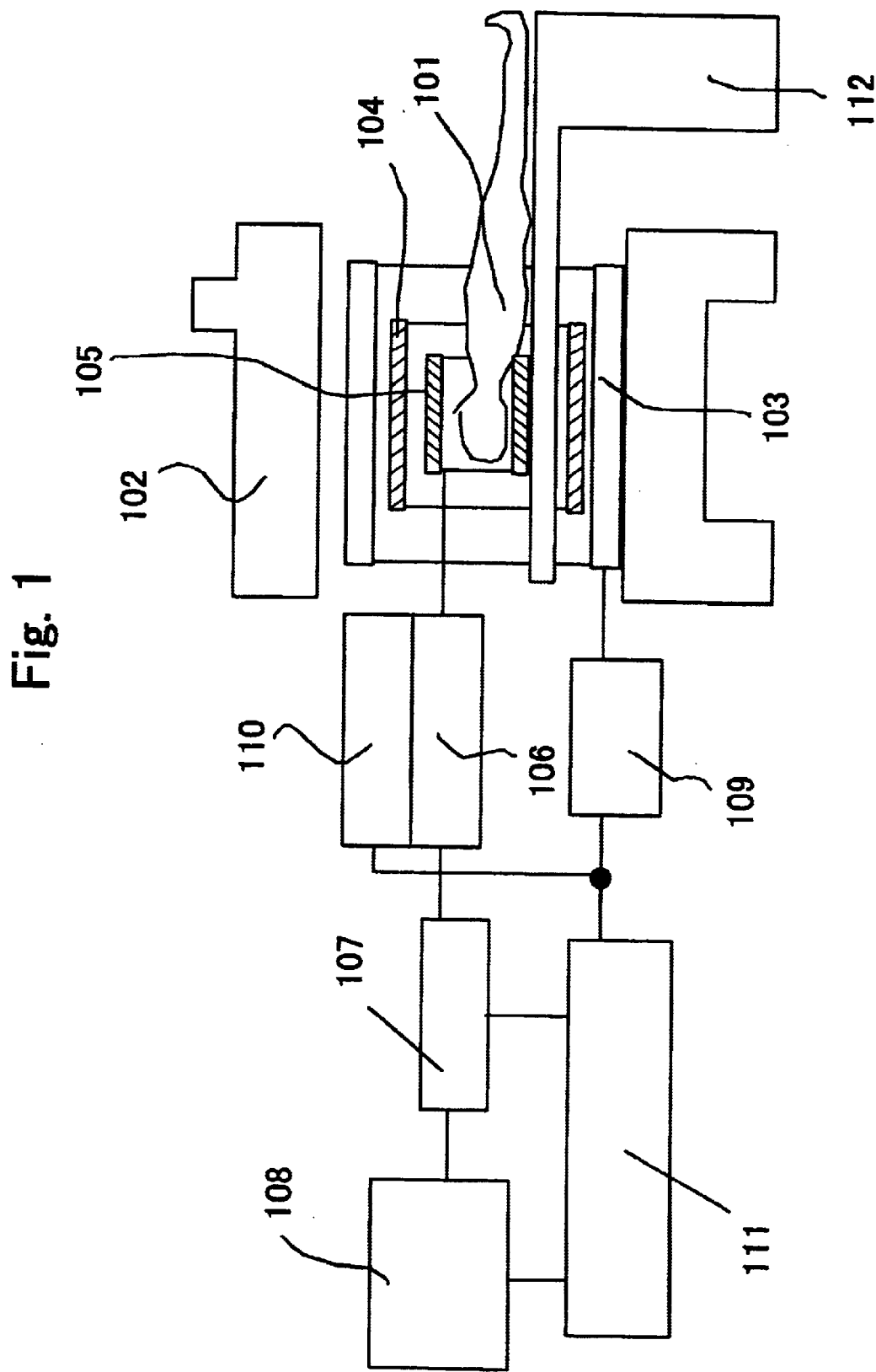

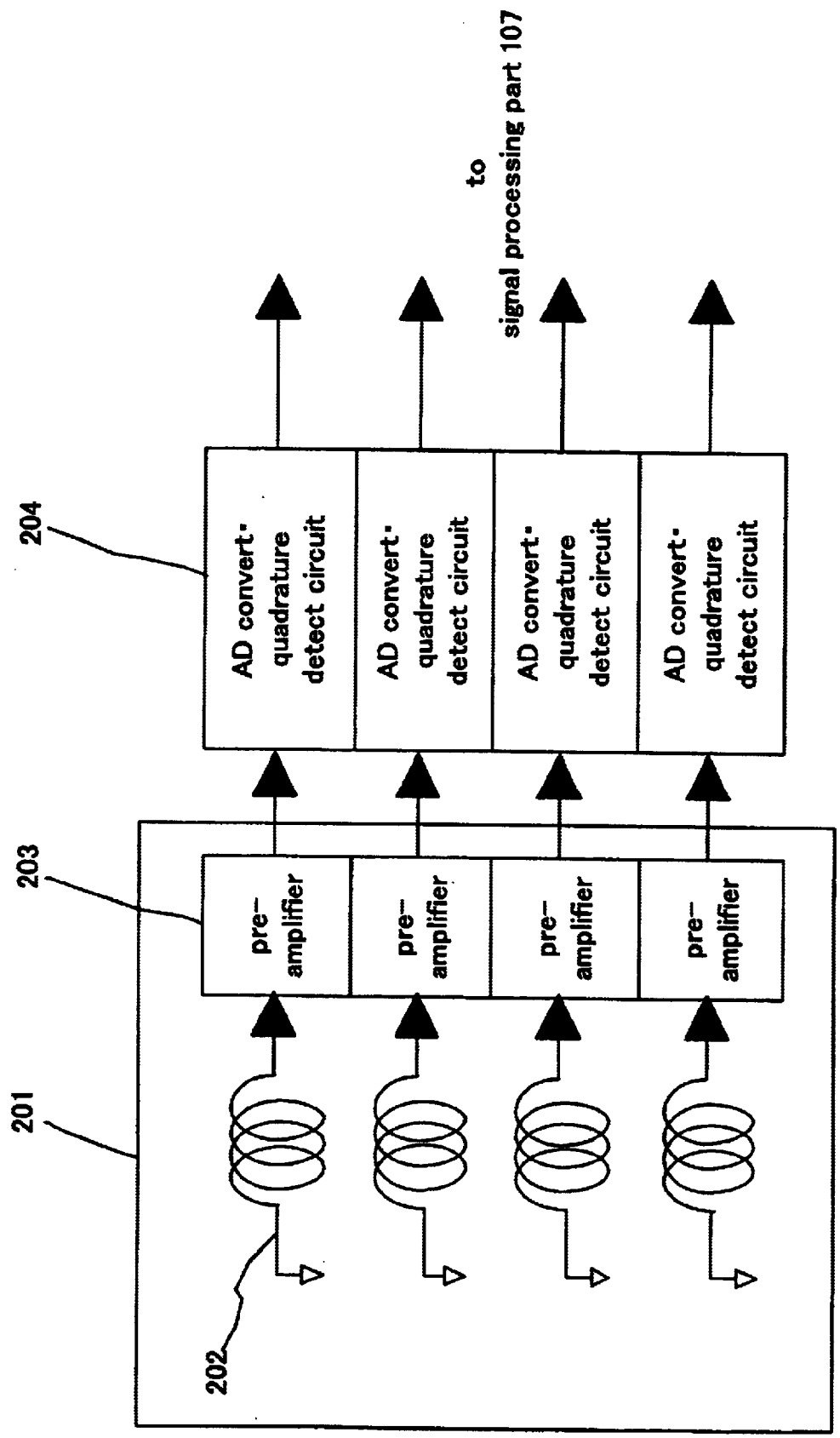

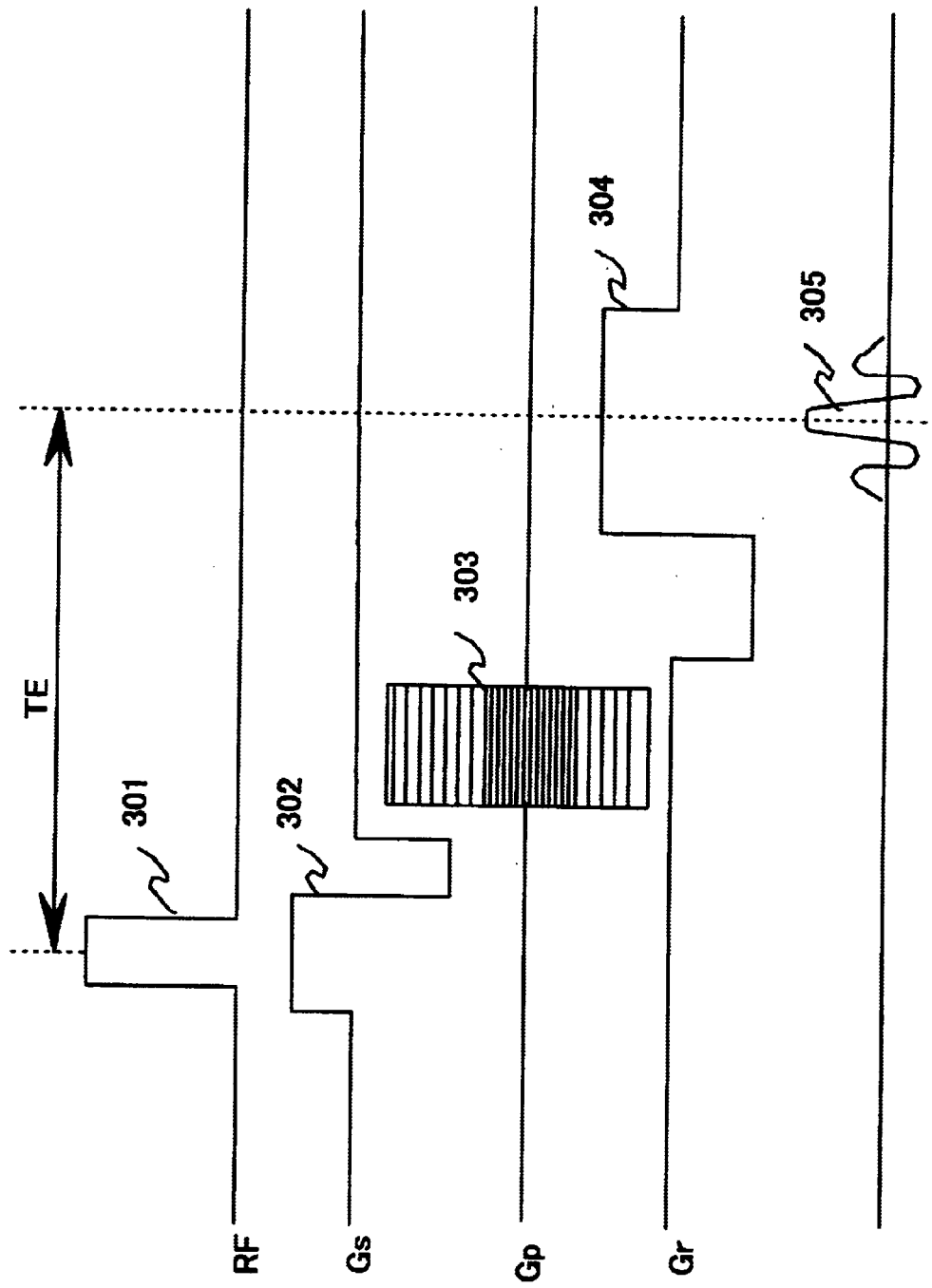

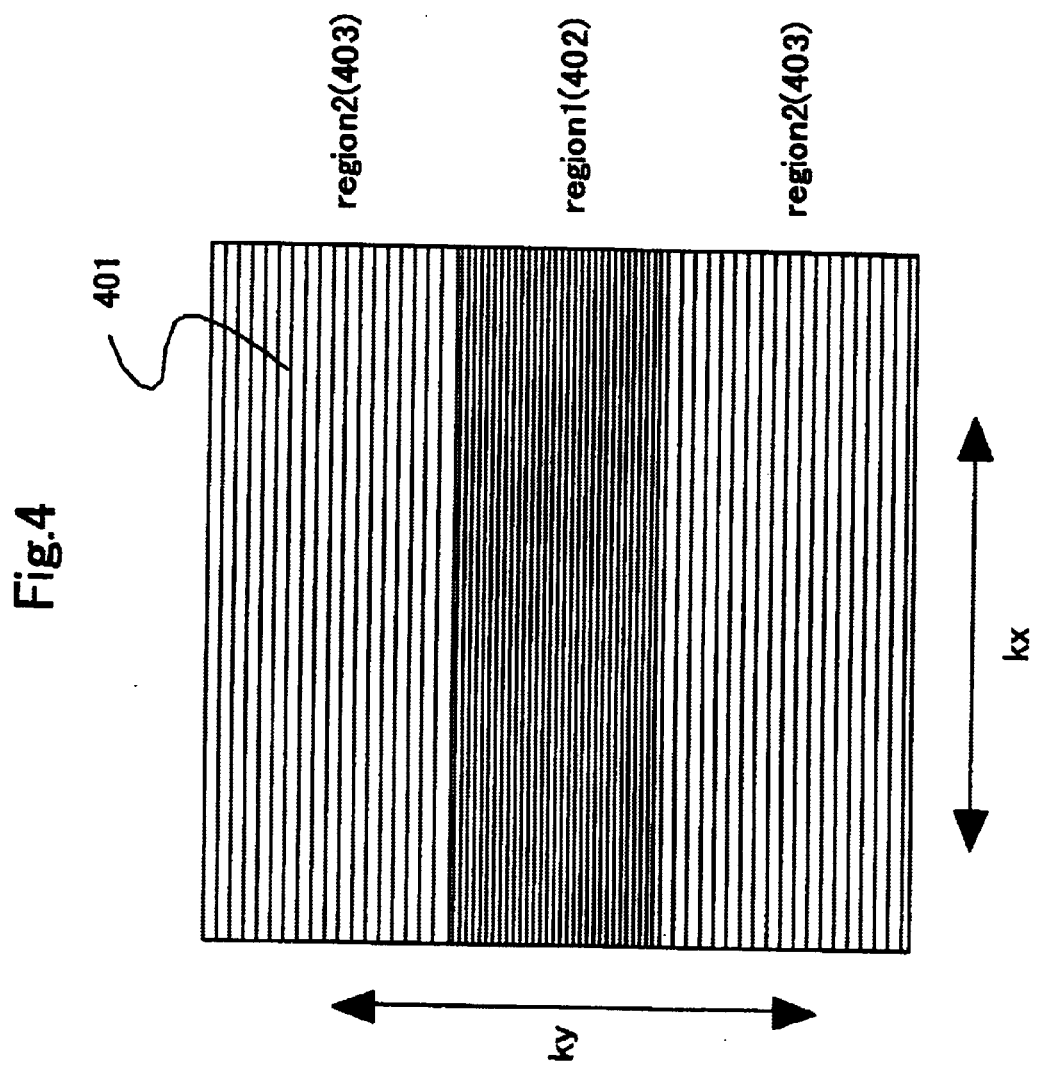

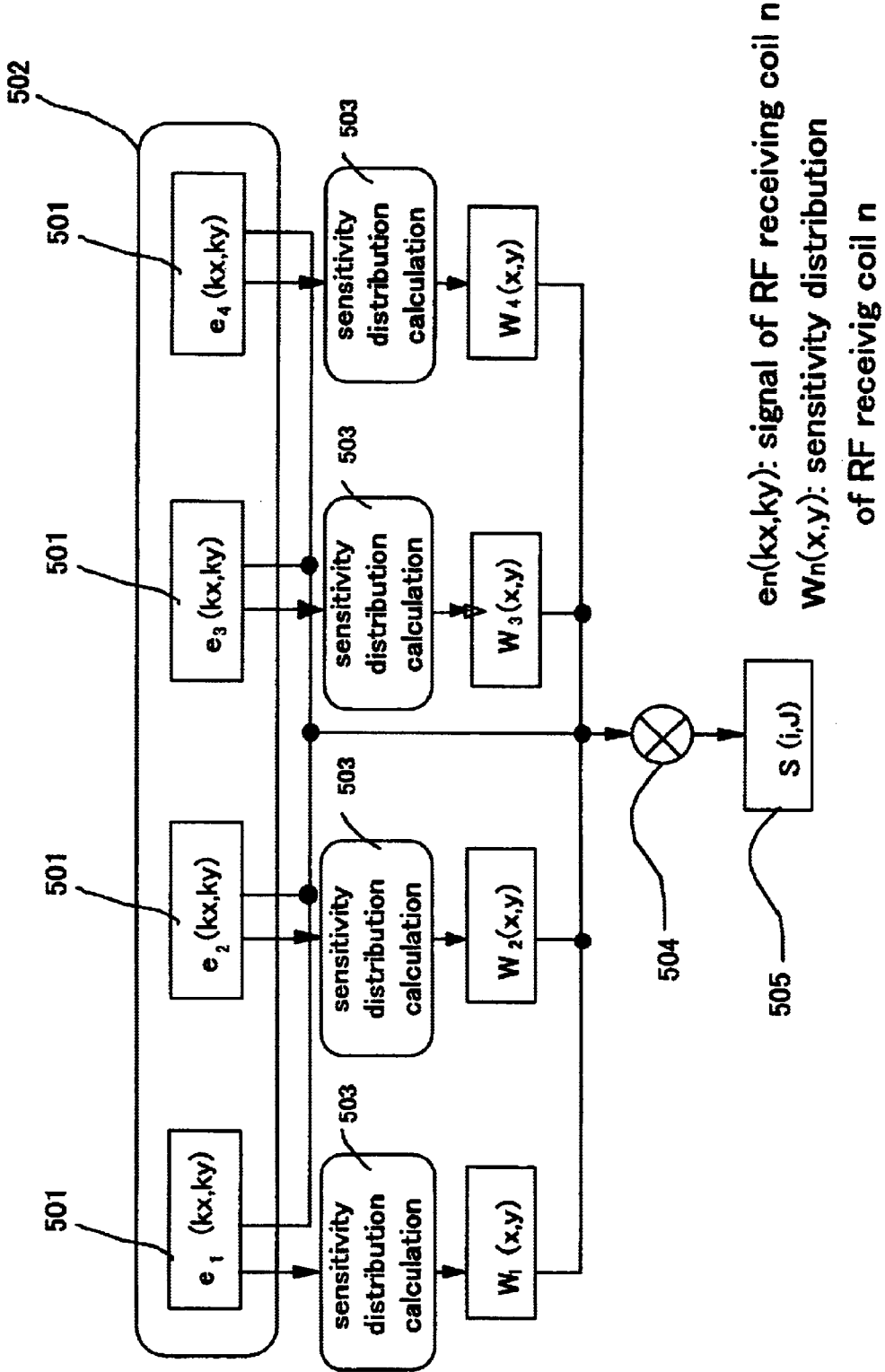

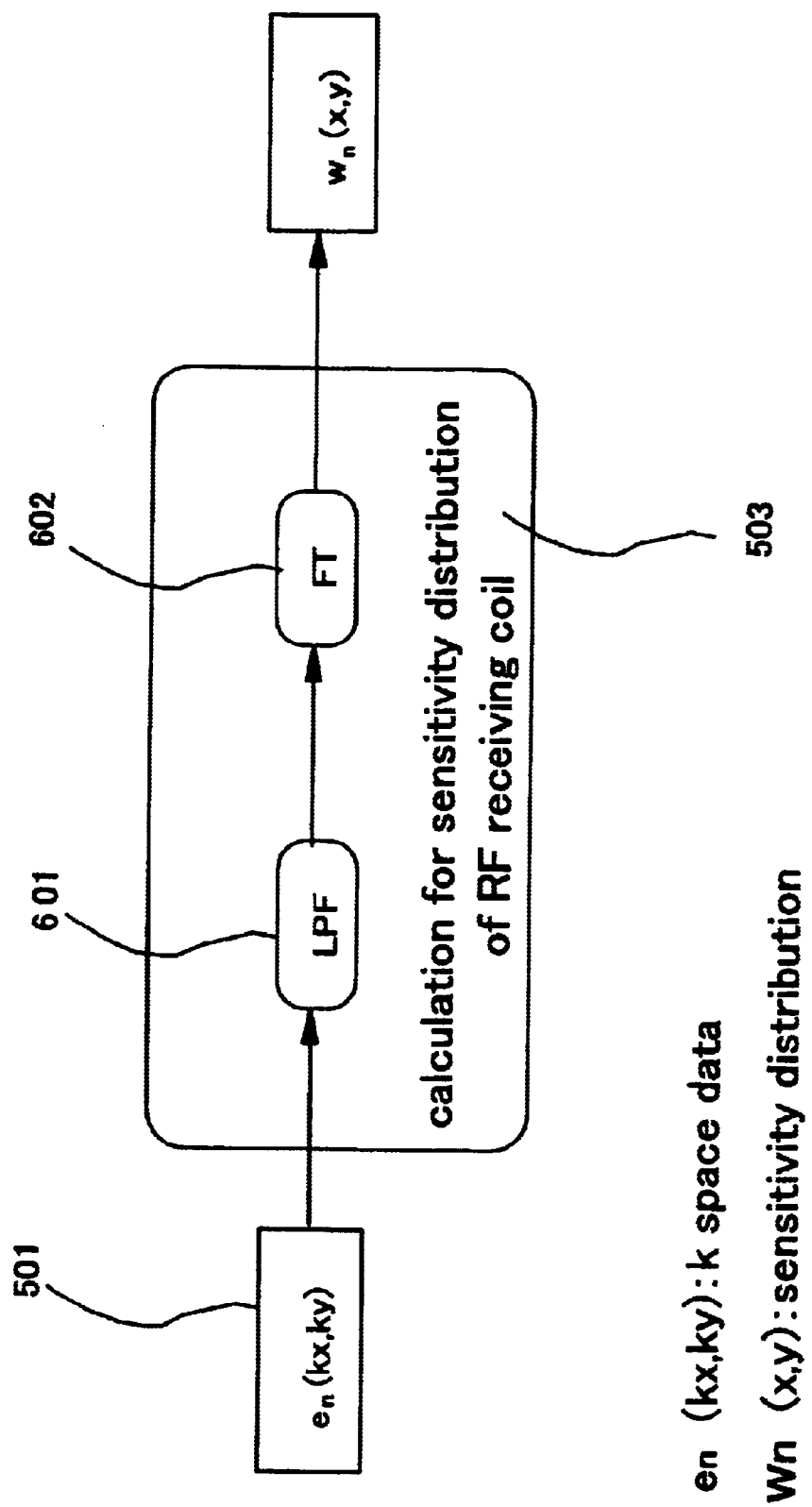

403  402  403

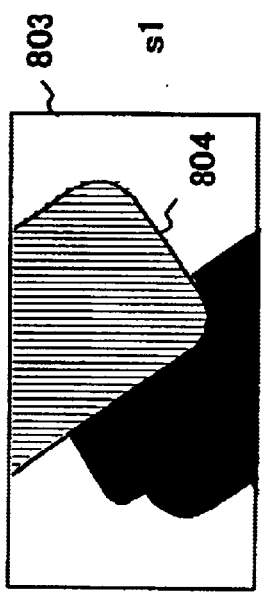
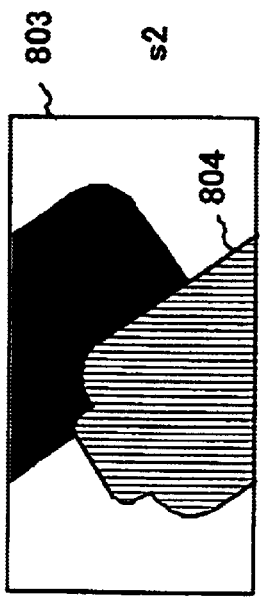
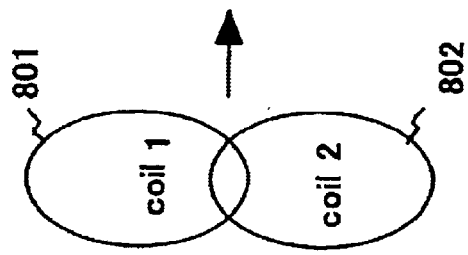
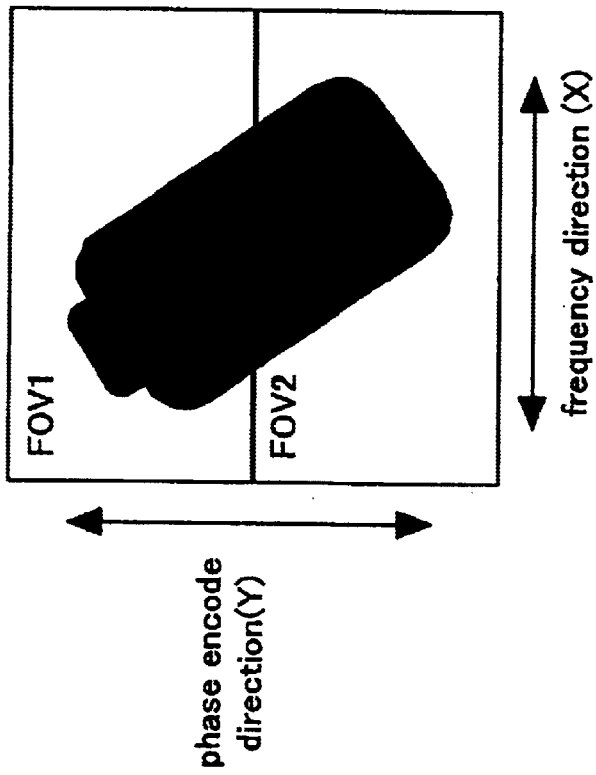

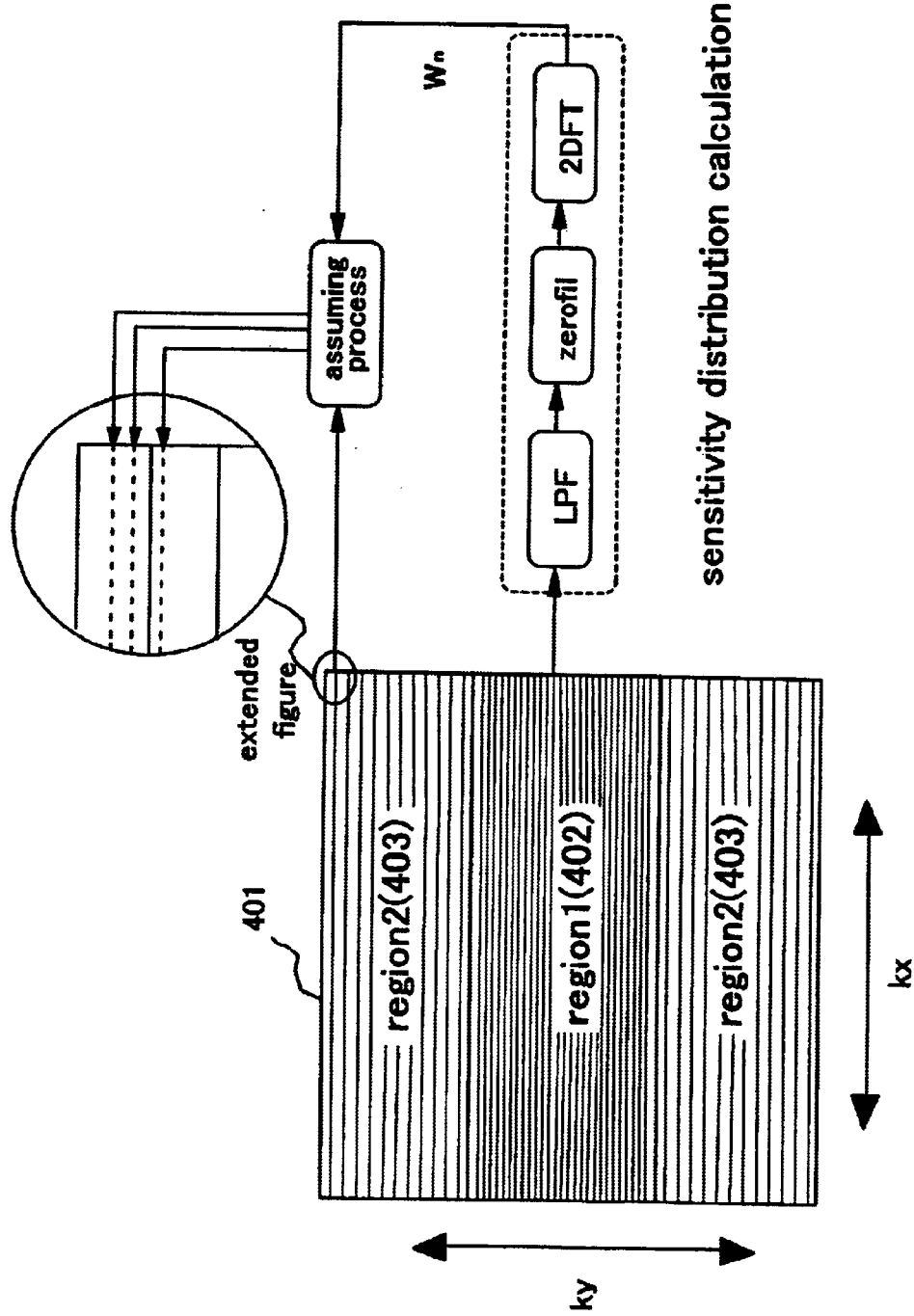

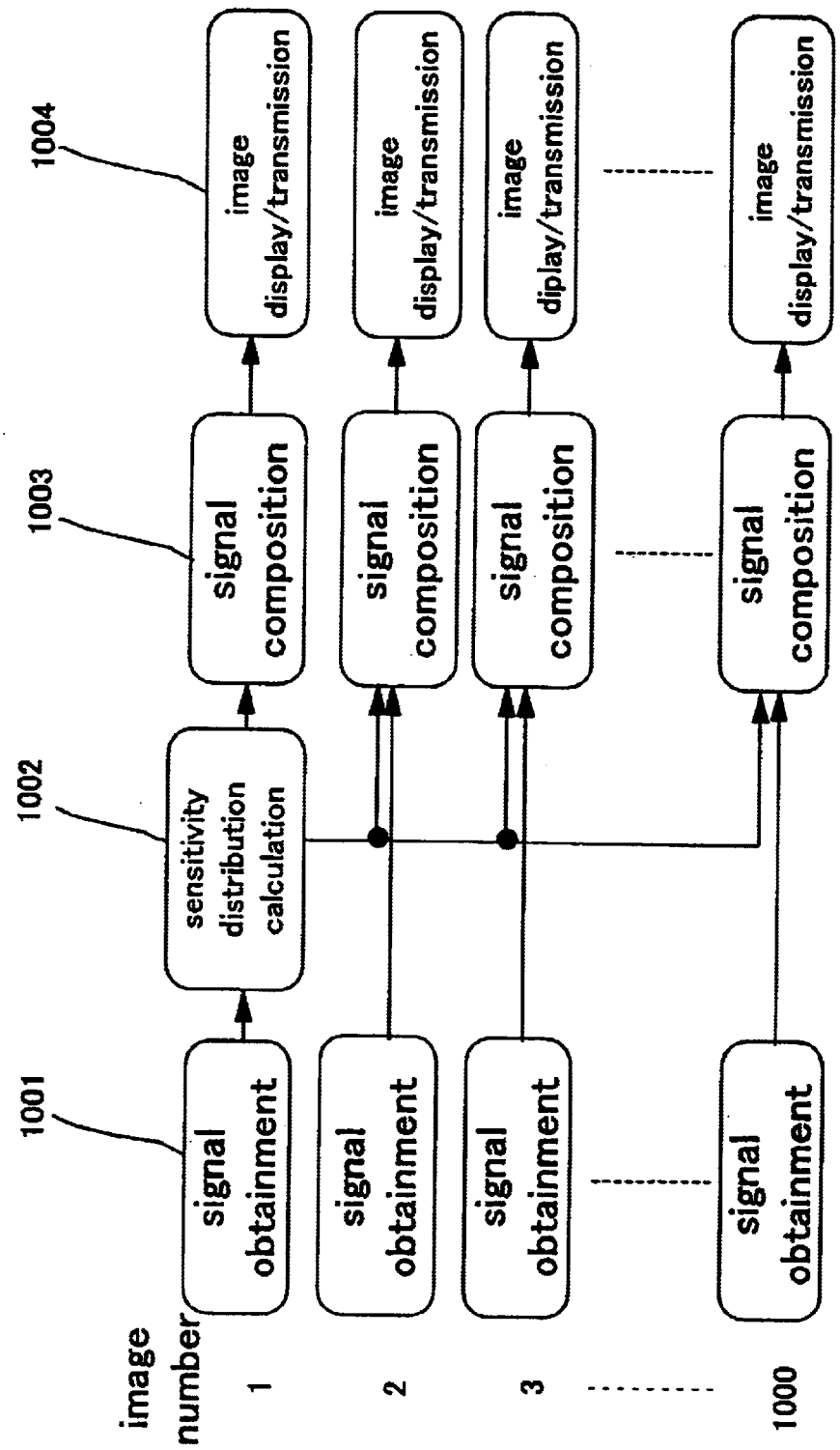

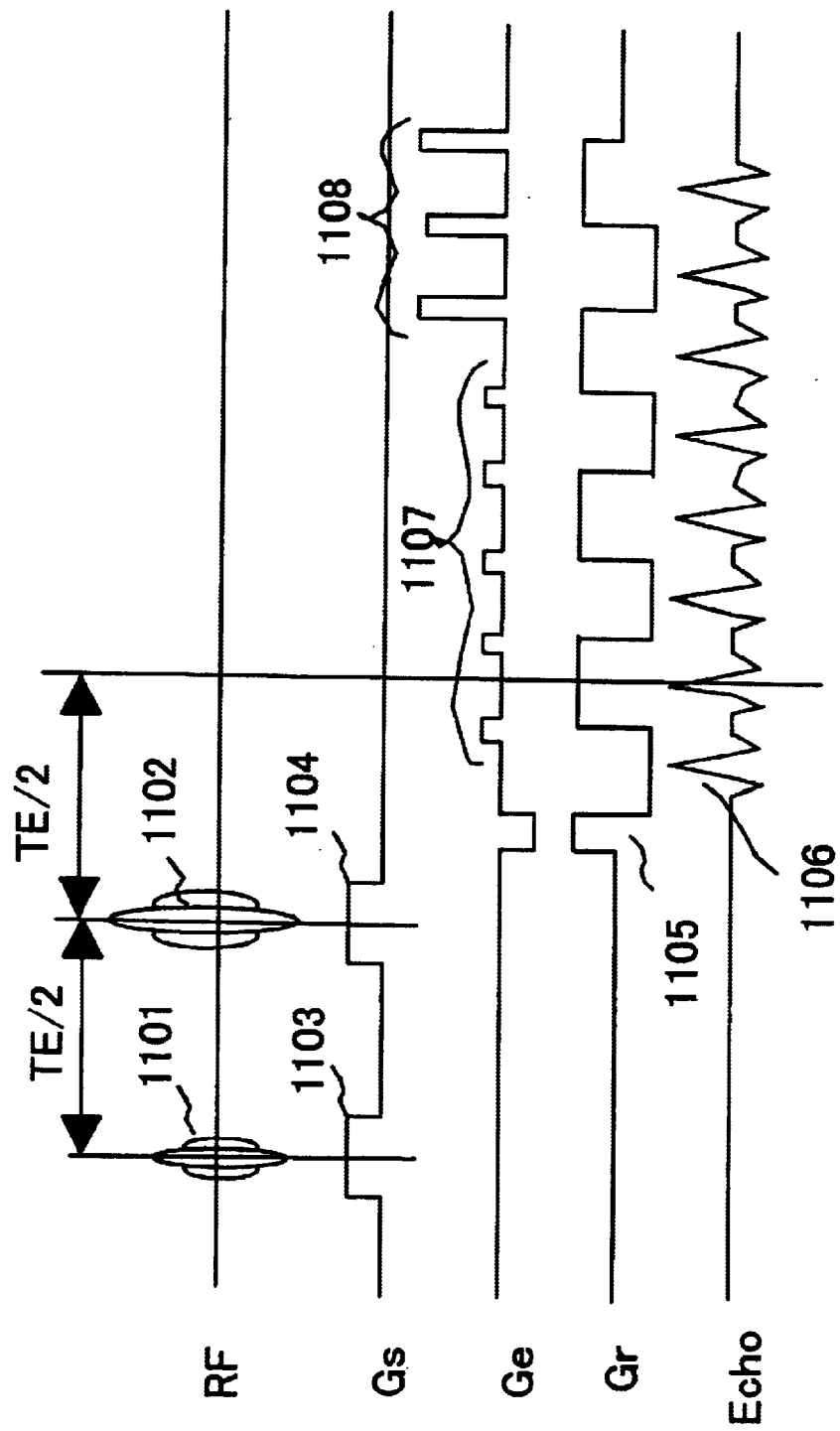

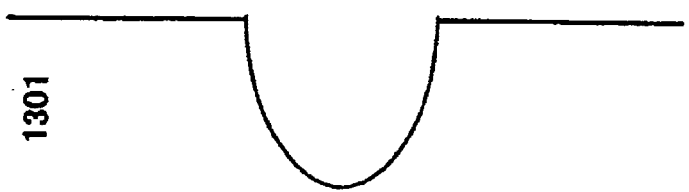
Fig. 13(a)
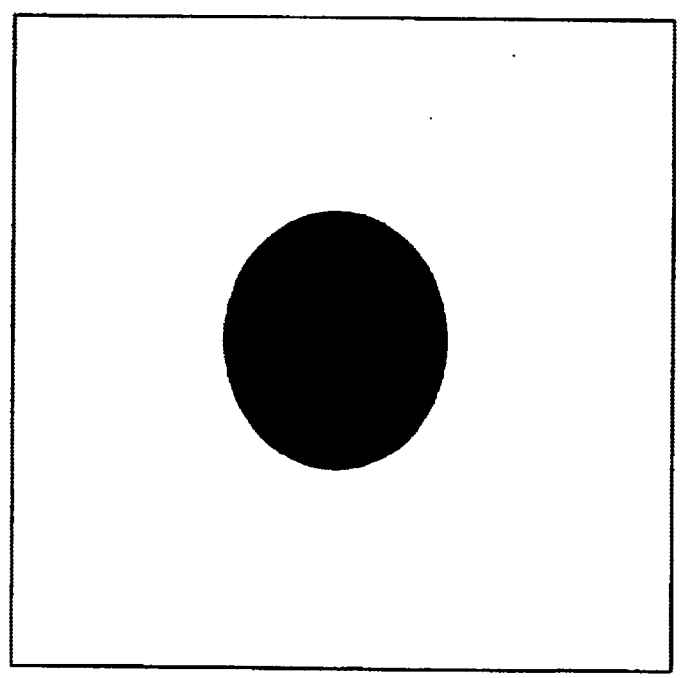
Fig. 13(b)
Fig. 13(c)

MAGNETIC RESONANCE IMAGING METHOD AND APPARATUS

FIELD OF THE INVENTION

The present invention relates to a nuclear magnetic resonance imaging (MRI) method and to apparatus for continuously measuring a nuclear magnetic resonance (hereinafter this is referred to as "NMR") signal obtained from hydrogen or phosphorus in an object to be examined, and for imaging the density distribution and relaxation time distribution or the like of a nuclear particle in the object.

BACKGROUND OF THE INVENTION

As a receiving coil to detect an NMR signal generated from an object in an MRI apparatus, a high sensitivity coil called a "multiple RF coil" or "phased array coil" has been used in recent years (Japanese Patent laid open No. 2-500175). A multiple RF coil is a coil dedicated to signal reception composed of an array of small type RF coils having a relatively high sensitivity, which is capable of receiving a signal in a wide field of view with high sensitivity. Various types of multiple RF coils have been proposed, including a static magnetic field type or a detecting part. In operation, the signals received with the respective unit coils of this multiple RF coil are combined to produce an image of the object to be imaged.

On the other hand, a method to shorten the imaging time by thinning out data in the phase encoding direction and using multiple coils has been proposed, for example, by [4] Daniel K Sodickson and Warren J Manning in an article entitled "Simultaneous obtainment of spatial harmonics (SMASH): fast imaging with radio frequency coil arrays", in Magnetic Resonance in Medicine, Vol. 38, pages 591–603, (1997), and by [5] J.Wang and A.Reykowski in an article entitled "A SMASH/SENSE related method using ratios of array coil profiles", in ISMRM 99. This kind of technology is referred to as a space encoding method or parallel MRI. An aliasing artifact in thinning phase encoded data is removed using the spatial difference between respective sensitivity distributions of a multiple RF coil. However, for the removal of this aliasing artifact, a highly accurate calculation using a highly accurate sensitivity distribution of the RF coil is necessary. This operation is performed in a measurement space (k space) in the method described in the above literature [4]. And, in the method described in the literature [5], the operation is performed in real space after Fourier transformation.

Generally, a sensitivity distribution of the multiple RF coil can be calculated from each of the received RF signals. More specifically, a method that images a phantom having a uniform density previously and regards the spatial shading of an image as a sensitivity distribution of the multiple RF coil, and a method that calculates it by use of a low frequency filter in connection with an image measured separately from the object, are known. However, these traditional methods involve the following problems.

That is, in the traditional methods, the process of calculating the sensitivity distribution of said RF coil is performed before imaging. Thus, for example, when imaging a part of an object, such as the abdomen of a patient, which changes its shape temporally with breathing, the shape of the object examined is likely to be different between the time the sensitivity distribution is calculated and the time the imaging is performed.

Also, the spatial arrangement of the RF coil fitted to the object is liable to change in accordance with the movement.

In addition, in case of imaging a patient during a surgical operation, the position of the RF coil can change with time.

Also, in case there is a demand to display these images in real time, the traditional method of using sensitivity data of the coils obtained previously can lead to an error, with a result that the quality of the image can be deteriorated.

Furthermore, measuring the sensitivity distribution of an RF coil prior to imaging extends the total imaging time, and so it creates a problem in that the effect of short-time imaging, which is a main characteristic of this technology, is deteriorated.

The present invention has been developed for the purpose of solving the above-mentioned problems.

SUMMARY OF THE INVENTION

To solve the above-mentioned problems, the present invention provides a magnetic resonance imaging method which involves the steps of:
(a) applying an RF pulse, a slice encoded gradient magnetic field, a phase encoded gradient magnetic fields, and a readout gradient magnetic field to the object to be examined, that is placed in a uniform static magnetic field, in accordance with a predetermined pulse sequence, and executing this pulse sequence repeatedly;
(b) detecting an NMR signal generated from the object to be examined by executing said step at each small type: RF coil composing a multiple coil, and storing the NMR signals in connection with the k space separately;
(c) performing a process of calculation of the sensitivity distribution of each coil using data only of a low spatial frequency region (hereinafter this is referred to as a "low region") at each k space; and
(d) performing the image composing process using the sensitivity distribution of a coil calculated in said step (c) and the measured data stored in connection with said k space.

The magnetic resonance imaging method of the present invention also involves steps of:
(a) preparing a k space having a predetermined matrix size for which to memorize NMR signals detected from the object to be examined;
(b) executing a pulse sequence for NMR imaging of the object to be examined, which has been placed in a uniform static magnetic field;
(c) memorizing NMR signals obtained by executing said pulse sequence into said k space;
(d) calculating the sensitivity distribution of a plural number of small type signal receiving coils forming a multiple coil by using one part of the NMR signal for imaging, which is memorized in connection with said k space; and
(e) composing the image by using the sensitivity distribution of the small type signal receiving coil calculated above and the NMR signal memorized in connection with said k space.

The magnetic resonance imaging method of the present invention is a method of imaging an object to be examined by using a multiple coil without the presence of an aliasing artifact, and involves the steps of:
(a) preparing a k space having predetermined matrix for which size to memorize NMR signals detected from the object to be examined with a number corresponding to small type signal receiving coil composing a multiple coil;
(b) executing a pulse sequence for the NMR imaging of the object to be examined, which is placed in uniform static magnetic field; the data in low region in the phase encoded direction being measured fine in the k space, and the data in high spatial frequency region (hereinafter referred to as a "high region") being measured roughly when this pulse sequence is executed;

(c) memorizing the measured data for imaging obtained by executing said pulse sequence in connection with the k space corresponding to a small type coil;

(d) calculating the sensitivity distribution of a plural number of small type signal receiving coils forming a multiple coil by using a part of the data measured for imaging and memorized in connection with said k space; and (e) composing an image of all fields of view of the multiple coil by using said calculated sensitivity distribution of said small type signal receiving coil and measured data memorized in connection with said k space.

The magnetic resonance imaging method of the present invention is a method for continuously imaging an object to be examined by using a multiple coil, comprising:

(a) preparing a k space having a predetermined matrix size to memorize NMR signal detected from the object to be examined;

(b) executing a pulse sequence for imaging a first NMR image of the object to be examined, which has been placed in a uniform static magnetic field;

(c) memorizing NMR signals obtained by executing said pulse sequence in connection with said k space;

(d) calculating the sensitivity distribution of a plural number of small type signal receiving coil which form a multiple coil by using a part of the NMR signals for imaging and memorizing it in connection with said k space;

(e) composing an image by using said calculated sensitivity distribution of a small type signal receiving coil and said NMR signal memorized in connection with said k space; and (f) executing a pulse sequence for imaging after the second image and composing an image by applying said memorized sensitivity distribution of said small type signal receiving coil to the obtained NMR signal.

Problems addressed by the present invention also can be solved by provision of a magnetic resonance imaging apparatus. In this regard, a magnetic resonance imaging apparatus of the present invention comprises:

a magnet for generating a uniform static magnetic field within the space accommodating the object to be examined;

a multiple coil comprised of a plural number of small type coils for detecting NMR signals generated from said object to be examined, said plural number of small type coils being arrayed to overlap a part of adjacent coils;

means for applying a high frequency magnetic field, a slice encoded gradient magnetic field, a phase encoded gradient magnetic field and a readout gradient magnetic field to image said object to be examined, where the phase encoding direction is directed in the direction of arrangement of said multiple coil;

means for controlling said magnetic field applying means, including means for modifying a step change in the application amount of said phase encoded gradient magnetic field in its high region relative to its low region;

measured data memorizing means for memorizing NMR signals detected in said multiple coil corresponding to each small type coil;

means for calculating the sensitivity distribution of each small type coil by using data of a low region in said phase encoded direction in every NMR signal detected by each small coil; and means for composing an image from said sensitivity distribution and said data memorized in said measured data memorizing means.

The magnetic resonance imaging apparatus of the present invention comprises:

a magnet for generating uniform static magnetic field within a space accommodating the object to be examined;

a multiple coil comprised of a plural number of small type coils, which are arranged to overlap with each other in a part of the adjacent coils, to detect NMR signals generated from said object to be examined;

means for applying a high frequency magnetic field, a slice encoded gradient magnetic field, a phase encoded magnetic field and a readout gradient magnetic field in accordance with a predetermined pulse sequence to image said object to be examined;

a k space for memorizing NMR signals detected by said multiple coil corresponding to each small type coil;

means for controlling said magnetic field applying means, including means for modifying a step change in the high region relative to the low region of the k space memorized measured data;

means for calculating the sensitivity distribution of each small type coil by using the data of the low region in said k space in every NMR signal detected by a small type coil; and means for composing an image from the sensitivity distribution and the data memorized in said memorizing means.

The magnetic resonance imaging apparatus of the present invention comprises:

means for executing a measurement repeatedly for imaging a predetermined slice of an object to be examined in an imaging unit;

means for calculating the sensitivity distribution of a multiple coil by using at least one part of measured data obtained for one image and memorizing it;

means for composing an image of all fields of view of the multiple coil by using said calculated sensitivity distribution; and means for applying the memorized sensitivity distribution without renewal to said image composition based on measured data after calculating the sensitivity distribution.

According to the present invention, because the sensitivity distribution of a small type RF coil is calculated from data obtained in a measurement for imaging, there is no difference in time between generation of the sensitivity distribution data and the measured data. Thus, even in MRI measurement in which the condition changes from time to time, it is easy to maintain stability. And, even in a measurement that demands real-time measurement, an error is not invited and the image quality is not deteriorated.

And, according to the present invention, since filtering is performed so as to connect the data of low region to zero smoothly in calculating the sensitivity distribution using data of the low region in the k space, a sensitivity distribution with no influence of an aliasing artifact can be calculated.

Also, since the sensitivity distribution of the RF coil is measured prior to imaging using measured data for imaging, without measuring the sensitivity distribution of the RF coil, the total imaging time does not have to be extended, and the effect of imaging in a short time does not to be degraded.

According to the present invention, in an embodiment for measuring an image continuously, the collection of measured data and image reconstruction following it are performed continuously, and control to display a plural number of images that last in terms of time can be performed. Also, the image reconstruction means uses the sensitivity distribution calculated from one measured data for reconstructing a plural number of images. Thus, in dynamic imaging in parallel MRI, the time for image reconstruction can be shortened and real-time measurement can be improved.

BRIEF DESCRIPTION OF THE DRAWINGS

FIG. 2 is a block diagram showing the main part of the MRI device shown in FIG. 1;

FIG. 3 is a waveform timing diagram showing one embodiment of a pulse sequence applied to an MRI apparatus of the present invention;

FIG. 4 is a diagram showing one example of a k space data array of measured data based on the pulse sequence shown in FIG. 3;

FIG. 5 is a schematic block diagram showing one embodiment of a signal processing unit in MRI apparatus of the present invention;

FIG. 6 is a diagram illustrating a sensitivity distribution calculation carried out in accordance with the present invention;

FIG. 8(a) is a diagram illustrating the imaging of an object using two coils, and FIGS. 8(b) and 8(c) are diagrams which show the images produced by the two coils, respectively, in accordance with the present invention;

FIG. 9 is a diagram showing an embodiment of a signal composition method of the present invention;

FIG. 10 is a diagram showing one embodiment of a continuous imaging process using the MRI apparatus of the present invention;

FIG. 11 is a timing diagram showing another embodiment of a pulse sequence for use in the MRI apparatus of the present invention;

FIG. 12 is a diagram showing another example of a k space data array of measured data according to the present invention;

FIGS. 13(a) to 13(c) are diagrams illustrating another embodiment of a sensitivity distribution calculation according to the present invention.

BEST MODE FOR CARRYING OUT OF THE INVENTION

Figure 1:
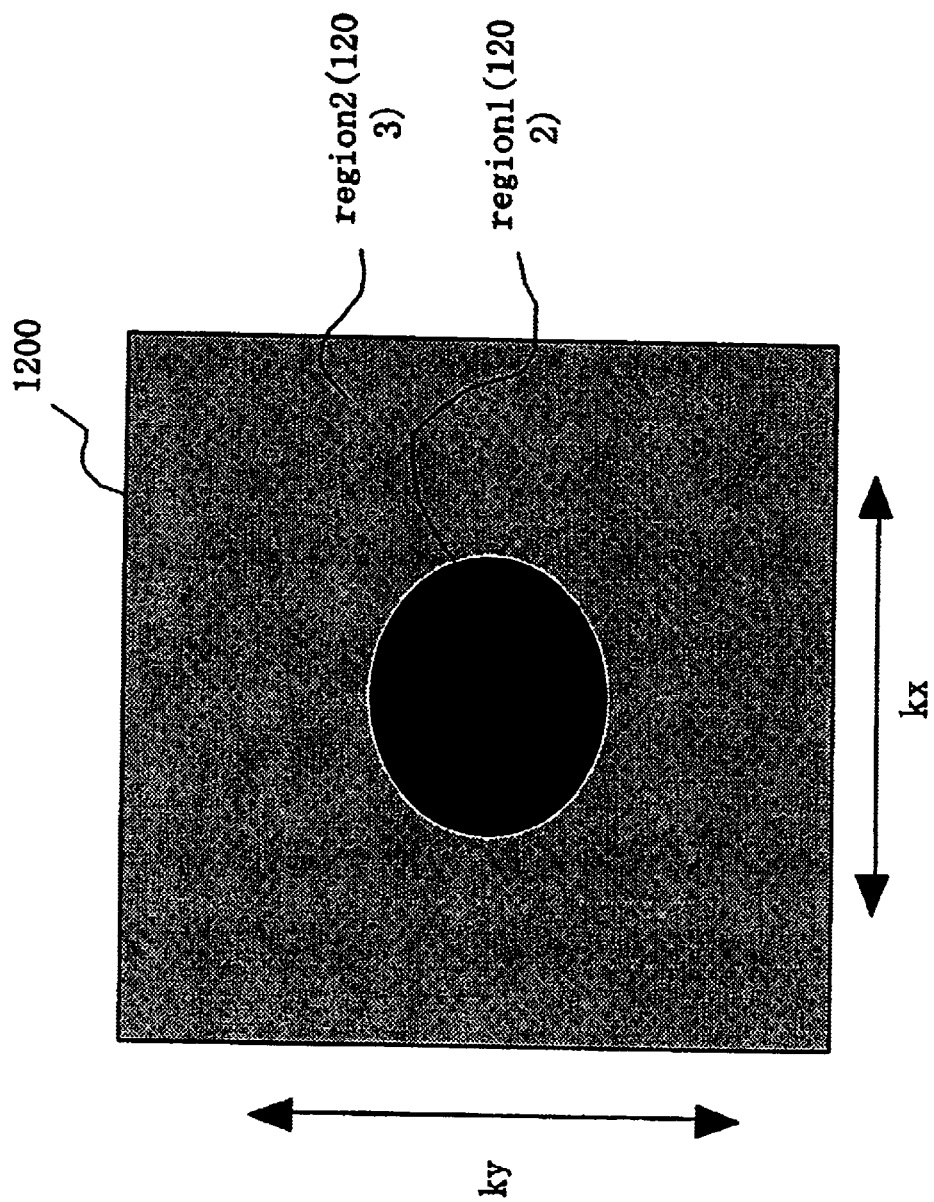
FIG. 1 is a block diagram of an MRI apparatus which to the present invention is applied.

Hereinafter, various embodiments of the present invention will be described with reference to the drawings. FIG. 1 is a view showing the composition of a typical MRI apparatus to which the present invention is applied. This MRI apparatus comprises a magnet 102 for generating a static magnetic field around the object 101 to be examined, a gradient magnetic field coil 103 for generating a gradient magnetic field in said space, an RF coil 104 for generating a high frequency magnetic field in this region, a signal receiving RF coil 105 for detecting an NMR signal generated from the object 101 to be examined, and a bed 112 for supporting the object 101 to be examined.

Gradient magnetic field coil 103 is composed of one pair of coils for generating a gradient magnetic field in three directions X, Y, Z, perpendicular to each other, and each gradient magnetic field coil generates a gradient magnetic field in accordance with the signal output from a gradient magnetic field power supply 109. By changing the method of application of the gradient magnetic field, an arbitrary slice of the object 101 can be selected, and position information can be given in the MR signal. A gradient magnetic field which applies position information to the MR signal is called a phase encoded gradient magnetic field, or a readout gradient magnetic field, by which a measuring space (k space), where measured data is disposed, is provided.

The RF coil 104 generates a high frequency magnetic field in accordance with a signal received from the RF signal transmitting unit 110. The frequency of this high frequency magnetic field is tuned with the resonant frequency of the nuclear spin that is an imaging target. An imaging target of the ordinary MRI is a proton, which is the main constituent material of the object. The signal received by the RF coil 105 is detected in signal detection unit 106, processed in the signal processing unit 107, and is also converted to an image signal through calculation.

As seen in FIG. 2, the RF coil 104 is a multiple coil arrangement 201 formed of a number of small type RF coils 202(in the figure, for example, four coils are provided). As each small type RF coil 202, for example, a rectangular surface coil of 15 cm on one side can be used, and those adjacent rectangular coils are disposed to overlap one another in the phase encoded direction of the measurement. They have detecting sensitivity regions divided relative to each other.

Each small type RF coil 202 is connected to a respective preamplifier 203, and the output from each coil is amplified in the respective preamplifier 203. Each preamplifier 203 is respectively connected in parallel to an AD convert-quadrature detect circuit 204, so as to form the signal detection unit 106. Signals detected in the respective AD convert-quadrature detect circuits 204 are transferred to the signal processing unit 107, which operates to perform Fourier transformation, filtering, composition calculation or the like for each coil. An MRI apparatus having a signal detecting part formed of a plural number of systems connected to multiple coils and each RF coil for composing it may be called a parallel MRI system. The process performed at signal processing unit 107 is previously programmed to build in a controlling part or memory device, which will be described later.

In FIG. 1, the gradient magnetic field power supply 109, the RF transmitting unit 110, the signal detection unit part 106 are controlled with their movement by control unit part 111, in accordance with a time chart generally referred to as a pulse sequence. In the MRI apparatus of the present invention, the control unit 111 controls the application of phase encoding in one part of a region of the k space so as to be rough.

Next, an imaging method using the above-described MRI apparatus will be described with reference to FIG. 3–FIG. 9.

FIG. 3 is a waveform timing diagram showing one example of a pulse sequence that is adopted for continuous imaging. This pulse sequence employs a gradient echo (GrE) method. After applying an RF pulse 301 together with a slice encoded gradient magnetic field pulse 302 and generating transverse magnetization by exciting the nuclear spin in a specified region of the object to be examined a phase encoded gradient magnetic field pulse 303 is applied, and then a readout gradient magnetic field pulse 304 is applied and echo signal 305 is measured. The echo time TE, which is the time period between the time of application of the RF pulse and the point in time that the echo signal reaches its peak value during measuring of the echo signal 305, is a parameter used to define the contrast of an image, and it is set in advance considering the organization or the like of the target.

By repeating this sequence a plural number of times while changing the application amount of the phase encoded gradient magnetic field (this is the integrated value of the gradient magnetic field intensity and the application time), obtained data is disposed to the k space.

FIG. 4 is a view showing an example of the k space data arrangement (k trajectory) of measured data that is measured with repetition of said sequence, and it is filled up with a signal obtained by performing one pulse sequence per one line of the k space in the transverse direction (kx direction). Also, the value of ky in the k space is defined by the application amount of the phase encoded gradient magnetic field given to the measured NMR signal. In a typical GrE sequence, the step of the phase encoded amount has an equal interval at each measurement. But, in the sequence of this embodiment, the phase encoded step in the region 1(402) differs from that in the region 2(403) on the k space. For example, in region 1(402), occupying a low region (low spatial frequency region) part in the phase encoded direction, the signal is closely spaced in the phase encoded (ky) direction. On the other hand, in region 2(402), occupying a high region (high spatial frequency region) part, the signal obtained is more widely spaced in the phase encoded direction. For example, in the data region occupying 10% up and down from the center of the k space (20% of the center part in all), the phase encoded amount is increased one step at a time. But, when it exceeds more than 10% each up and down, the phase encode amount is increased two or four steps at a time. As a result, the whole imaging time can be shortened, because the number of executing pulse sequences is reduced for a thinned number.

The ratio in the whole k space occupied by region 1(402) (about 20% in the embodiment of the present invention) can be set appropriately by considering both the coil sensitivity and the shortening of the measuring time. When the coil sensitivity is sharp, it is preferable to increase the ratio. On the other hand, it is preferable to reduce the ratio from the viewpoint of shortening the measuring time. Data arrangement in the k space is typically in the form of a 256×256 matrix in the directions of kx and ky. In region 1(402), data is collected in this density. In region 2(403), data is sampled two to four times roughly of the typical data arrangement in the direction of phase encoding. This means that a data measurement is performed in region 1(402) with a matrix by which the field of view (FOV) can be displayed in 256 pixels in the phase encoded direction, and measurement is performed in region 2 to produce a FOV of ½ to ¼.

The measured data is transferred to the signal processing unit 107 per receiving coil, and measured data per receiving coil is taken in a different k space. Then, as shown in FIG. 5, the sensitivity distribution of each receiving coil is calculated on the basis of the data of each receiving coil (503), and a composing process to form an image is performed with the sensitivity distribution of each receiving coil and a signal from each receiving coil (504). That is, by using signal $e_n$ (kx, ky) from each coil, a sensitivity distribution image $W_n$ (x, y) of each coil is calculated. Here, n given to $e_n$ and $W_n$ refers to the coil number. In this embodiment, n is 1,2,3 or 4. Also, (kx,ky) represents coordinates of the k space and (x, y) represents a position in real space. By using the sensitivity distribution image and signal, the entire image S(x, y) 505 is composed. The sensitivity distribution calculation 503 and composing process 504 will be described in more detail.

FIG. 6 is a view showing the procedure used to calculate the sensitivity distribution of an RF coil from a signal $e_n$(kx,ky) 501 of each receiving coil. At first, a low pass filter (LPF) 601 is used to retain only data of region 1 in the signal $e_n$(kx,ky) in the phase encoded direction. This filtering process is performed as a pre-processing to remove the aliasing artifact that is generated in the phase encoded direction by a difference in the FOV in the measuring region 1(402) and the region 2(403), when Fourier transformation is performed over the whole k space (401) including region 1(402) and region 2(403). To remove the aliasing artifact, a one-dimensional filter can be used, but a two-dimensional filter is preferable for removing the minute structure of a living body. For example, a Gaussian type, a humming type, and a hanning type are suitable for 2 dimensional filters. As a more highly precise filtering method, it is possible to employ a method using a flying window in the image space.

Figure 7B:
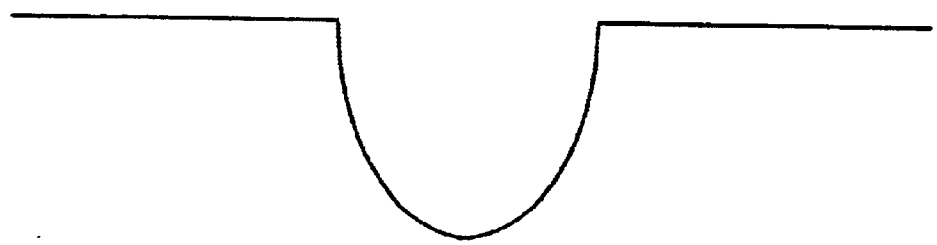
FIGS. 7(a) and 7(b) are diagrams which show the correspondence between the k space and the filter profile of a filter used in the filter process in accordance with the present invention.
Figure 7A:
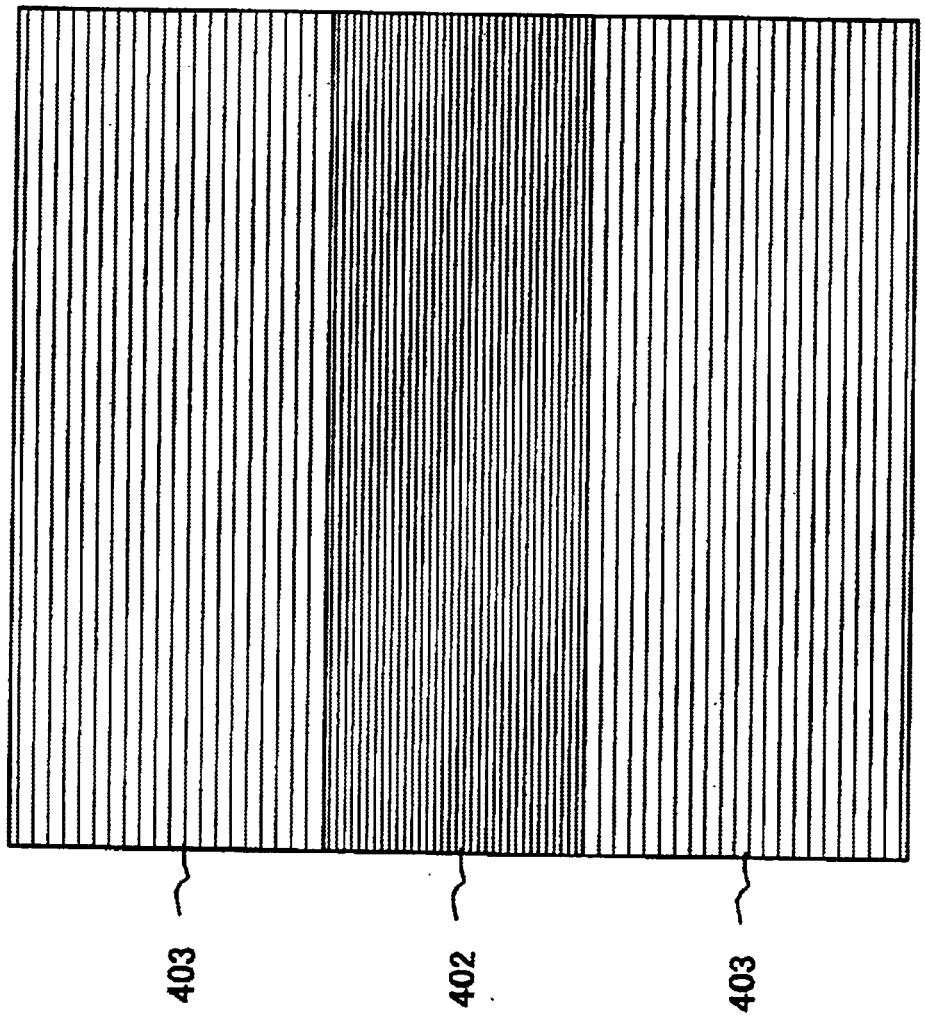

FIGS. 7(a) and 7(b) show the correspondence between the k space and the filter profile of a filter used in the filtering process. When filtering is performed in the k space with a filter having such a filter profile, all of the data of region 2(403), as shown in FIG. 7(b), is zero, and the boundary between region 1(402) and region 2(403) can be connected smoothly. It is effective to smoothly connect the boundary between the region 1(402) and the region 2(403), rather than to have it change sharply, for preventing generation of an aliasing artifact Next, measured data arranged in region in the k space corresponding to each coil is subjected to two-dimensional Fourier transformation (FT) 602. But, before that, the matrix of each k space to be subjected to two-dimensional Fourier transformation is made to have the density for measurement of region 1, and region 2 in each k space is filled with zero. And, with the two-dimensional Fourier transformation being performed at each k space, an image composed only of a low frequency component in the signal measured at each coil can be taken out, respectively. It is known that these low frequency images are regarded as the sensitivity distribution of each RF coil. In this embodiment, this is defined to be the sensitivity distribution $W_n(x,y)$ Incidentally, in multi-slice imaging, the sensitivity distribution of the coils needs to be calculated at each slice of each coil. And, because the signal obtained at each coil becomes a function of the three-dimensional measuring space (kx,ky,kz), in case of three dimensional imaging, it is possible to calculate a three-dimensional sensitivity distribution $W_n$(x, y, z) of the coil by expanding the Fourier transformation to three dimensions by using a three-dimensional filter as the low pass filter. Next, the operation 504 for obtaining a composed image by using this sensitivity distribution $W_n$(x, y) will be described. This composing calculation involves a method performed in the imaging space (real space) and a method performed in the measuring space. Both of them can be adopted.

FIGS. 8(a), 8(b) and 8(c) conceptually illustrate a method for performing composition of an image in the imaging space. To simplify the explanation, a case of imaging the object by using a multiple coil composed of two small type coils 801, 802 will be considered.

In this case, coil 801 has a FOV1, and coil 802 has a FOV2. The sensitivity distribution of each coil overlaps that of the other coil at least at one part. Measurement of the NMR signal is, for example, performed with the GrE sequence shown in FIG. 3, and echo signals measured at coil 801 or coil 802 are arranged respectively in the k space as shown in FIG. 4. As explained above, performing two-dimensional Fourier transformation in two k spaces that take in a signal separately from two coils, as the data is collected roughly (by thinning out) in the phase encoded direction in region 2 of the k space, as shown in FIG. 4, then, an image coming from coil 1(801) is reconstructed as shown in FIG. 8(b), and an image coming from coil 2(802) is reconstructed as shown in FIG. 8(c). And at each image, an aliasing artifact 804 is generated in phase encoded direction on image 803. These artifacts have a low brightness because they are signals from a low sensitivity region at each coil.

The aliasing artifact 804 can be removed by multiplying the artifact sensitivity distribution of each small type coil, so as to obtain an image having no overlapping on the images due to the aliasing artifact, as shown in FIG. 8(a). This method has been referred to in the section "SENSE" of the above-disclosed publication by said J. Wang et al.; therefore, a detailed explanation thereof will be omitted.

In the method of composing a signal in the measuring space, the composed sensitivity distribution obtained by the composed sensitivity distribution of each small type RF coil with appropriate weights is defined to have a desired spatial frequency in accordance with the number of small type RF coils which form the multiple coil. Then, the data lacking in the imaging space is made up.

For example, it is assumed that the composed sensitivity distribution Wcomp(x,y) of the form exp(i·mΔky·y), where m is an integer, can be obtained by the composed sensitivity distribution $W_n(x,y)$ of a small type RF coil with appropriate weight Cn.

$$Wcomp(x,y)=\Sigma C j W j(x,y)=\exp(im\Delta ky\cdot y) \quad (1)$$

Signal S(kx,ky) composed at this point is shown in the next equation.

$$S(kx,ky)=\int\int dxdy Wcomp(x,y)\rho(x,y)\exp\{-ikxx-ikyy\} \quad (2)$$

$$=\int\int dxdy\rho(x,y)\exp\{-ikxx-i(ky-m\Delta ky)y\}$$
$$=\rho^\wedge(kx, ky-m\Delta ky)$$

In the equation (2), ρ represents magnetization density, and ^ represents two-dimensional Fourier transformation. As is understood from the equation (2), ρ^ (kx,ky−mΔky) can be calculated from ρ^(kx,ky) by using the composed sensitivity distribution Wcomp(x,y). This means that data in the interval between the data that is roughly arranged in the phase encoded direction of k space can be filled.

FIG. 9 is the view showing this method conceptionally. As shown in the figure, at first, the sensitivity distribution can be calculated with zero filling (making data to be zero in the region 2 of the k space, except region 1 with the density of region 1) and two-dimensional Fourier transformation processing (2DFT) of measured data in the region 1(402) extracted with LPF processing. Next, for region 2(403), where measured data is arranged roughly by thinning out, lacking data (corresponding to the dotted line in the enlarged figure) is formed from measured data (corresponding to the solid line in the enlarged figure) from said calculation. The number of new data (number of dotted lines) formed by said process depends on the number of small type RF coils. When the number of small type RF coils is four, four arrangements of new data can be formed. In the example shown in the figure, the thinning-out rate is four and the number of data being formed is three.

Thus, the data after being supplemented to obtain new data is the same as the data measured without thinning out the entire region of k space, and an image without an aliasing artifact can be obtained by performing two-dimensional Fourier transformation to this data. Incidentally, since this method has been referred to in the above-mentioned document "SMASH" written by Daniel K Sodickson et al, a detailed explanation thereof will be omitted.

According to the embodiment of the present invention, imaging is performed while shortening the time by thinning out a part of the phase encoding, and an RF coil sensitivity distribution is obtained with no influence of aliasing using data in a precise part of measured data obtained for the imaging. Then, the time difference between the measurement for calculating the sensitivity distribution and the measurement for imaging can be eliminated, and the operation error following the time difference can be eliminated.

In addition, according to the embodiment of the present invention, by obtaining especially thick data of a low phase encoded component, including main image information in the measured data, the S/N ratio of the images are hard to be deteriorated and extremely effective images can be produced in a diagnosis of a clinical application. Moreover, by adding the process of performing Fourier transformation thickly to the two-dimensional image "(256×256 pixels)" without an aliasing artifact being obtained by said method again in the phase encoded direction, and by replacing the data estimated in the high region of the phase encoded direction from the data obtained (appearing alternately on the phase encoding) with measured data already obtained thickly (Fourier transformed already in the readout direction), or adding and averaging the estimated data and actual measured data in a hybrid space, the obtained data in region 1 can be utilized not only for removing an aliasing artifact, but also 100% as a data element for image reconstruction. Therefore, a final image with high S/N ratio can be obtained.

Furthermore, according to the embodiment of the present invention, it is not necessary to perform a previous measurement for calculating the sensitivity distribution of a coil. Thus, not only is a time-shortening effect in measurement for imaging achieved, but also a shortening of the measuring time as a whole can be achieved. In case of continuous imaging, it is preferable to attain both the effect of said high S/N ratio and the time-shortening effect of imaging. FIG. 10 shows an embodiment in which the present invention is applied to a dynamic imaging for obtaining a continuous image in real time by repeating imaging in a time series. In the dynamic imaging according to this embodiment, the signal obtained respectively at each small type RF coil of the multiple coil is composed, and image display/transfer is repeated continuously, whereby continuous image (image number1,2,3 . . . 1000) is obtained in time series. In the first image obtained, each step of the signal obtainment 1001, sensitivity distribution calculation 1002, and signal composing 1003 are performed similarly to the steps 502, 503, 504 shown in FIG. 5, and an image in which the aliasing artifact is removed is reconstructed by using the sensitivity distribution calculated according to the sensitivity distribution calculation 1002. This image is displayed on the display of the MRI apparatus, or it is transferred to an external display device or memory device (1004). The result of the sensitivity distribution calculation at the first image obtainment is memorized in a specified address location of a memory in the signal processing unit.

Next, the second image is obtained. When the second image is obtained, composing processing 1003 to remove an aliasing artifact is performed by using the sensitivity distribution data calculated in the first image obtainment stored in memory after the signal obtainment. After that, as long as the disposition of signal receiving coil does not change, calculation of the sensitivity distribution is not performed and a composing process is performed using the sensitivity distribution data in memory. Since the sensitivity distribution does not change when the disposition of receiving coil does not change, the result of the first sensitivity distribution calculation, as described above, can be used. Thus, even when the imaging interval (interval between an image obtainment and the next) is shortened in dynamic imaging, an operation for imaging can be performed quickly, and the ability to generate a display in real time (time resolution) can be improved. For example, when a fast sequence, such as EPI, is adopted as an imaging sequence, it is important to make the operation fast for performing effective continuous fast imaging, and the condition of the object can be monitored in real time by applying the embodiment shown in FIG. 10.

Next, an MRI apparatus that employs the EPI sequence suitable for the MRI apparatus described above will be explained. In this embodiment, the composition of the apparatus is the same as the one shown in FIG. 1. The MRI apparatus in this embodiment employs the EPI sequence for controlling the collection of measured data as a control sequence in control unit 111 so as to have a different density at each region of the measuring space (k space). FIG. 11 shows one embodiment of such an EPI sequence, and an EPI sequence of the spin echo type is shown there. That is, the RF pulse 1101 for exciting nuclear spin of organization of the object and a slice selective gradient magnetic field pulse Gs 1103 are applied, and after the time period TE/2, the RF pulse 1102 for inverting the transverse magnetization generated from the first RF pulse 101 is applied, together with slice selective gradient magnetic field pulse Gs 1104; and, after that, the echo signal 1106 is measured while continuously applying the readout gradient magnetic field 1105 that alternates in polarity. In this procedure, phase encoded gradient magnetic fields Ge 1107 and 1108 for the phase encoding echo signal are applied.

In the ordinary EPI sequence, for example, if the matrix size of the k space is 128×128, the readout gradient magnetic field is inverted 128 times, and 128 echo signals are measured. The phase encoded gradient magnetic field pulse is applied with 128 pulses of the same size other than the first offset pulse. But, in the EPI sequence of the present embodiment, for example, the echo signal of from the phase encoding 0 to that of a predetermined phase encoding is subjected to a phase encoded gradient magnetic field pulse 1107 of such a size that the number of phase encodings increments one by one. The echo signal measured after that is subjected to the phase encoded gradient magnetic field pulse 1108 of such size that it increments by four at each step.

In the example shown in the figure, the case of measuring eight echo signals is shown for simple explanation. Until the fifth signal measurement, a phase encoded gradient magnetic field pulse 1107 of ordinary size is applied. From the sixth to the eighth signal measurement, a phase encoded gradient magnetic field pulse 1108 having a size four times as large as the ordinary size is applied. Signals from the first to the fifth measurement shown in FIG. 4 correspond to region 1(402) in the k space, and signals from the sixth to the eighth measurement correspond to region 2(403). Then, whereas signals from the sixth to the eighth measurement have hitherto needed time for measuring 12 (=3×4) signals, the measuring time for nine (=12−3) signals can be used to shorten this sequence. Regarding the k trajectory, measurement can be performed thickly in region 1 and can be performed roughly in region 2 while performing said sequence. In executing the EPI sequence shown in FIG. 11, only the top or bottom part of region 2 shown in FIG. 4 is measured. In this case, the part that is not measured in region 2 is estimated by jointly using measured data, a known half Fourier method and a signal estimating processing method utilizing complex conjugation.

The present invention can be applied to not only a spin echo type EPI sequence as described above, but it can also be applied to a gradient echo type EPI, and to a one shot type EPI collecting necessary measured data with one excitation or to a multishot type (division type) EPI.

The MRI apparatus based on the second embodiment of the present invention is suitable for use as a sequence of parallel MRI using said multiple coil. Also, in the case of applying said EPI sequence to a parallel MRI, the process performed in signal processing unit is the same as that in the case of a GrE sequence. In other words, as shown in FIG. 5, by performing sensitivity distribution calculation 503 at each small type RF coil in the multiple coil, using data measured by said EPI sequence, together with composing process 504 using the calculated sensitivity distribution, an image from which an aliasing artifact is removed can be obtained.

And, in the case of dynamic imaging, a sensitivity distribution calculation is performed only in the reconstruction of the first image, as shown in FIG. 10, and, as for images after that, the process from signal obtainment to image display and transfer is performed continuously using the same sensitivity distribution. In this case, as described above, the signal obtaining time of the EPI sequence of the present invention is shortened compared with an ordinary EPI sequence. Besides, the sensitivity distribution calculation of each signal obtainment does not need to be performed apart from measurement for imaging, or the sensitivity distribution calculation. And so, extremely fast continuous imaging can be performed.

The above explanation is directed to various embodiments of the MRI apparatus of the present invention. However, it is possible to modify the present invention in various ways, not limited by these embodiments. For example, though a GrE sequence and an EPI sequence have been illustrated as a pulse sequence for performing parallel MRI in the explanation set forth above, the present invention also can be applied to a known sequence, such as a FSE (fast spin echo sequence), a SE (spin echo sequence), a Burst sequence, and a spiral sequence. In addition, it can be also expanded to three dimensional imaging.

FIG. 12 is a view showing the k trajectory 1200 in the case of a spiral sequence. In this case, circular region 1 at the center of the k space(1202) is a region where signals are arranged thickly, and in region 2 surrounding it, signals are arranged roughly. To calculate the sensitivity distribution from measured data of the spiral sequence, a two-dimensional filter having a filter profile 1301, 1302, as shown in FIGS. 13(a), 13(b) and 13(c), is used. As this two-dimensional filter, a two-dimensional Gaussian filter, a two-dimensional hanning filter, a two-dimensional hamming filter or the like are used. By using the sensitivity distribution at each small type coil calculated from measured data of the region 1(1202), an image in which an aliasing artifact is removed is obtained. This is the same as the case in another sequence.

According to the MRI apparatus of the present invention, in performing parallel MRI using a multiple coil, imaging is performed while shortening the measuring time by thinning out one part of a region in the k space, and the sensitivity distribution is calculated using data of the region where the measured data is thick to compose signals. Therefore, the image quality is not deteriorated in an imaging in which real-time imaging is demanded. Especially, by obtaining data thickly of the low frequency component in the k space, an image having a high S/N ratio and a high diagnosis value can be obtained.

Also, since there is no need to measure the sensitivity distribution-of the RF coil before imaging, the total measure time is not extended. Therefore, the effect of imaging in a short time, which is a main characteristic of parallel MRI techniques, can be achieved.

What is claimed is:

1. A magnetic resonance imaging method of imaging an object to be examined at high speed using a magnetic resonance phenomenon, comprising the steps of:
    (a) applying an RF pulse, a slice encoded gradient magnetic field, a phase encoded gradient magnetic field, and a readout gradient magnetic field to the object to be examined, which has been placed in a uniform static magnetic field, in accordance with a predetermined pulse sequence, and executing this pulse sequence repeatedly;
    (b) detecting NMR signals generated from the object to be examined by executing said detecting step at each of a plurality of small type RF coils which form a multiple coil, and memorizing the resulting NMR signals in a memory corresponding to a k space for each RF coil separately; and
    (c) performing image composing processing using a sensitivity distribution of an RF coil and measured data memorized in said memory,
    wherein in a step (a) a step change of an application amount of said phase encoded gradient magnetic field in measuring a low spatial frequency region of the k space is made to be smaller than a step change in measuring a high spatial frequency region therein, in said pulse sequence executed repeatedly, between step (b) and step (c) there is further step (d) performing a process of calculation of a sensitivity distribution of each RF coil using data of the low spatial frequency region of the k space, and in step (c) using the sensitivity distribution of an RF coil calculated in step (d).

2. The magnetic resonance imaging method defined in claim 1, wherein a low path filter is used for extracting said low spatial frequency region alone of said k space in the process of calculating the sensitivity distribution at each coil to make the data of said high spatial frequency region zero and to make the connection between an abstracted region and a zero region thereof smooth.

3. The magnetic resonance imaging apparatus defined in claim 3, wherein the region of k space, except where abstracted data of said low spatial frequency region alone is memorized, is filled with zeros with the same density as the low spatial frequency region, and the k space comprised of this low region data and the zero data of the other region is subjected to Fourier transformation to calculate the sensitivity distribution of an RF coil.

4. The magnetic resonance imaging method as defined in claim 1, wherein in step (d) the calculation of the sensitivity distribution of each RF coil uses data only of the low spatial frequency region of the k space.

5. The magnetic resonance imaging method as defined in claim 1, wherein in step (a) the step change of the application amount of said phase encoded gradient magnetic field in measuring the low spatial frequency region of the k space is made to be one step amount of the phase encoded gradient magnetic field, in step (b) detecting every NMR signal corresponding to the low spatial region of the k space, in step (d) the calculation of the sensitivity distribution of each RF coil uses all data of the low spatial frequency region of the k space.

6. The magnetic resonance imaging method as defined in claim 1, wherein in step (b) memorizing NMR signals for an image and NMR signals for the sensitivity distribution act effected in separate memory us corresponding to the k space respectively, in step (d) the calculation of the sensitivity distribution of each RF coil uses at least one part of data on the low spatial frequency region of the k space memorized in the memory of the NMR signals for the sensitivity distribution.

7. A magnetic resonance imaging method of imaging an object to be examined at high speed using a multiple coil, comprising the steps of:
    (a) preparing a memory having a predetermined matrix size in which to memorize NMR signals detected from the object to be examined;
    (b) executing a pulse sequence for NMR imaging of the object to be examined, which has been placed in a uniform static magnetic field;
    (c) memorizing NMR signals obtained by executing said pulse sequence into said memory; and
    (d) composing an image by using a sensitivity distribution of a plural number of small type signal receiving coils forming said multiple coil and NMR signals memorized in said memory;
    wherein between step (c) and (d) there is further step (e) calculating the sensitivity distribution of the small type signal receiving coils by using one part of said NMR signals for imaging, which have been memorized in said memory, and in step (d) using the sensitivity distribution of the small type signal receiving coils calculated in step (e).

8. A magnetic resonance imaging method of imaging an object to be examined using a multiple coil without generating an aliasing artifact, comprising the steps of:
    (a) preparing a memory corresponding to k space having a predetermined matrix size in which to memorize NMR signals detected from the object to be examined, the number of NMR signals corresponding to the number of small type signal receiving coils which form said multiple coil;
    (b) executing a pulse sequence for NMR imaging of the object to be examined, which has been placed in a uniform static magnetic field;
    (c) memorizing the measured data for imaging obtained by executing said pulse sequence into said memory corresponding to a small type coil; and
    (d) composing an image of the fields of view of the multiple coil by using a sensitivity distribution of a small type signal receiving coil and measured data memorized in said memory;
    wherein in step (b) data in a low spatial frequency region is measured finely in the k space, and data in a high spatial frequency region is measured roughly, when said pulse sequence is executed, between step (c) and step (d) there is further step (e) calculating the sensitivity distribution of the plural number of small type signal receiving coils forming said multiple coil by using at least one part of the data measured in the low spatial frequency region of the k space and memorized in said memory, and in step (d) using the sensitivity distribution of the small type signal receiving coil calculated in step (e).

9. The magnetic resonance imaging method as defined in claim 8, wherein in step (b) the data in the low spatial frequency region in the phase encoded direction is measured finely in the k space, and the data in the high spatial frequency region in the phase encoded direction is measured roughly, when said pulse sequence is executed.

10. A magnetic resonance imaging method continuously imaging an object to be examined using a multiple coil, comprising the steps of:
(a) preparing a first memory corresponding to a k space having a predetermined matrix size in which to memorize NMR signals detected from the object to be examined;
(b) executing a pulse sequence for imaging a first NMR image of the object to be examined, which has been placed in a uniform static magnetic field;
(c) memorizing NMR signals obtained by executing said pulse sequence into said first memory;
(d) composing an image by using a sensitivity distribution of a plural number of small type signal receiving coils which form said multiple coil and the NMR signals memorized in said first memory; and
(e) executing a pulse sequence for imaging after a second imaging of the object to be examined and composing an image by applying the sensitivity distribution of the small type signal receiving coils to the obtained NMR signal:
wherein in step (b) data in a low spatial frequency region is measured finely in the k space, and data in a high spatial frequency region being measured roughly, when said pulse sequence is executed, between step (c) and step (d) there is further step (f) calculating the sensitivity distribution of the plural number of small type signal receiving coils by using the data measured in the low spatial frequency region of the k space which is memorizing into a second memory, and in step (e) using the sensitivity distribution of the small type signal receiving coils memorized in the second memory in step (f).

11. A magnetic resonance imaging apparatus comprising:
a magnet for generating a uniform static magnetic field within a space accommodating an object to be examined;
a multiple coil composed of a plural number of small type coils for detecting NMR signals generated from said object to be examined, said plural number of small type coil being arrayed so as to overlap in part with adjacent coils;
means for applying a high frequency magnetic field, a slice encoded gradient magnetic field, a phase encoded gradient magnetic field and a readout gradient magnetic field to image said object to be examined, where the phase encoded direction is directed in the direction of arrangement of said multiple coil;
means for controlling said magnetic field applying means, including means for modifying a step change in the application amount of said phase encoded gradient magnetic field in its high region relative to that in its low region;
measured data memorizing means for memorizing an NMR signal detected in said multiple coil corresponding to each small type coil;
means for calculating the sensitivity distribution of each small type coil by using data of the low region in said phase encoded direction for every NMR signal detected by each small coil; and
means for composing an image from said sensitivity distribution and data memorized in said measured data memorizing means.

12. The magnetic resonance imaging apparatus defined in claim 11, wherein said measured data memorizing means has a predetermined matrix memorizing arrangement, and said controlling means includes means for covering a measured data memorizing address location where measured data falls out in high region in the phase encoded direction with data calculated from actual measured data and said sensitivity distribution.

13. The magnetic resonance imaging apparatus defined in claim 11, wherein said means for calculating the sensitivity distribution of said small type coils includes filtering means for abstracting a low region in the phase encoded direction of data memorized in said measured data memorizing means and means for performing two-dimensional Fourier transformation on composed data comprised of low region data abstracted and zero data filled in the region except for the low region.

14. The magnetic resonance imaging apparatus defined in claim 13, wherein said filtering means comprises a filter having a filter profile for smoothing the connection of data between the low region abstracted in the direction of phase encoding and the high region filled with zeros.

15. A magnetic resonance imaging apparatus, comprising:
a magnet for generating a uniform static magnetic field within a space accommodating an object to be examined;
a multiple coil composed of a plural number of small type coils for detecting NMR signals generated from said object to be examined, said plural number of small type coils being arrayed so as to overlap in part with adjacent coils;
means for applying a high frequency magnetic field, a slice encoded gradient magnetic field, a phase encoded gradient magnetic field and a readout gradient magnetic field in accordance with a predetermined pulse sequence to image said object to be examined;
a k space for memorizing NMR signals detected by said multiple coil corresponding to each small type coil;
means for controlling said magnetic field applying means, including means for modifying a step change in the high region and in the low region of said k space memorizing measured data;
means for calculating the sensitivity distribution of each small type coil by using data of the low region in said k space in every NMR signal detected by a small type coil; and
means for composing an image from said sensitivity distribution and the data memorized in said memorizing means.

16. A magnetic resonance imaging apparatus, comprising:
means for executing a second measurement repeatedly after a first measurement for imaging a predetermined slice of an object to be examined in an imaging unit; and
means for composing an image of all fields of view of a multiple coil by using a sensitivity distribution of the multiple coil,
wherein said first measurement measures data in a low spatial frequency region finely in a k space and data in a high spatial frequency region roughly, said second measurement measures the data in all regions of the k space roughly, the apparatus includes means for calculating the sensitivity distribution of said multiple coil by using at least one part of the measured data in the low spatial frequency region of the k space acquired in said first measurement which is memorized in a memory, such said image composing means uses said memorized sensitivity distribution, the apparatus further includes means for applying said memorized sensitivity distribution without renewal to the image composition based on measured data after calculating the sensitivity distribution.

17. A magnetic resonance imaging apparatus, comprising:

a magnet for generating a uniform static magnetic field within a space accommodating an object to be examined;

a multiple coil composed of a plural number of small type coils for detecting NMR signals generated from said object to be examined;

means for applying a high frequency magnetic field, a slice encoded gradient magnetic field, a phase encoded gradient magnetic field and a readout gradient magnetic field to image said object to be examined;

means for controlling said magnetic filed applying means, including means for modifying a step change in an application amount of said phase encoded gradient magnetic field in measuring a high spatial frequency region of a k space relative to that in a low spatial frequency region;

measured data memorizing means for memorizing an NMR signal detected in the multiple coil corresponding to each small type coil;

means for calculating a sensitivity distribution of each small type coil by using data of the low spatial frequency region of the k space for each small coil; and means for composing an image from the sensitivity distribution and data memorized in said measured data memorizing means.

18. A magnetic resonance imaging apparatus, comprising:

a magnet for generating a uniform static magnetic field within a space accommodating an object to be examined;

a multiple coil composed of a plural number of small type coils for detecting NMR signals generated from said object to be examined;

means for executing a pulse sequence for NMR imaging of said object to be examined;

means for measuring data in a low spatial frequency region around center portion finely in a k space, and data in a high spatial frequency region away from the center portion roughly, when said pulse sequence is executed;

measured data memorizing means for memorizing an NMR signal detected in said multiple coil corresponding to each small type coil;

means for calculating a sensitivity distribution of each small type coil by using the data of at least the low spatial frequency region for each small coil; and means for composing an image from said sensitivity distribution and data memorized in said measured data memorizing means.

19. The magnetic resonance imaging apparatus as defined in claim 18, wherein said data measurement means measures the data along a spiral trajectory through the k space.

* * * * *